United States Patent [19]

Brown

[11] 4,027,268
[45] May 31, 1977

[54] DEMODULATOR FOR PM OR FM SIGNALS

[75] Inventor: Kenneth H. Brown, Scottsdale, Ariz.

[73] Assignee: Motorola, Inc., Chicago, Ill.

[22] Filed: June 12, 1975

[21] Appl. No.: 586,473

[52] U.S. Cl. .............................. 329/142; 325/349; 329/204
[51] Int. Cl.$^2$ .......................................... H03D 3/26
[58] Field of Search .......... 329/110, 112, 119, 129, 329/130, 131–134, 137, 138, 142, 204, 205 R; 325/349, 344

[56] References Cited

UNITED STATES PATENTS

| 3,437,941 | 4/1969 | Leary | 329/142 |
| 3,614,640 | 10/1971 | Wolf | 329/110 |

Primary Examiner—Siegfried H. Grimm
Attorney, Agent, or Firm—Eugene A. Parsons

[57] ABSTRACT

A demodulator for demodulating a phase modulated (PM) or frequency modulated (FM) signal into a baseband signal includes detector arrangement for converting said PM or FM signal into two outputs, means for summing the two outputs and means for modifying the summed outputs to generate the baseband signal of substantially the same amplitude across its frequency spectrum.

1 Claim, 8 Drawing Figures

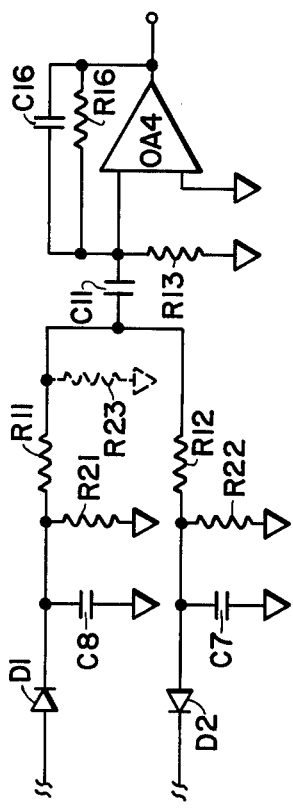
FIG. 6
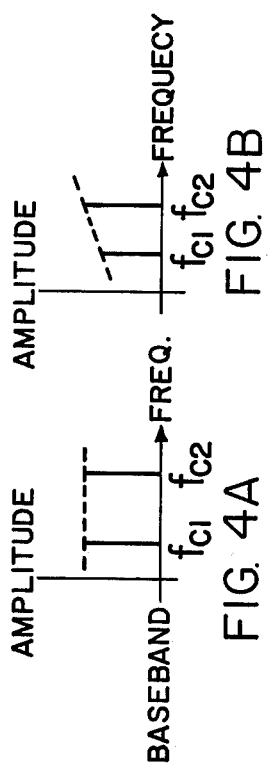
FIG. 2A
FIG. 2B
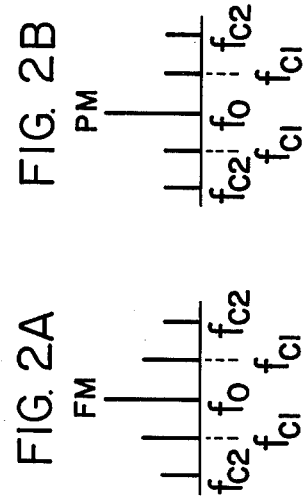
FIG. 3
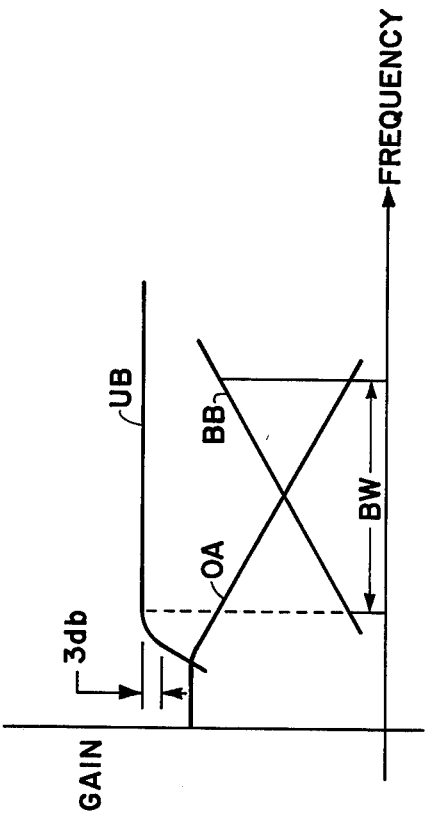
FIG. 4A
FIG. 4B
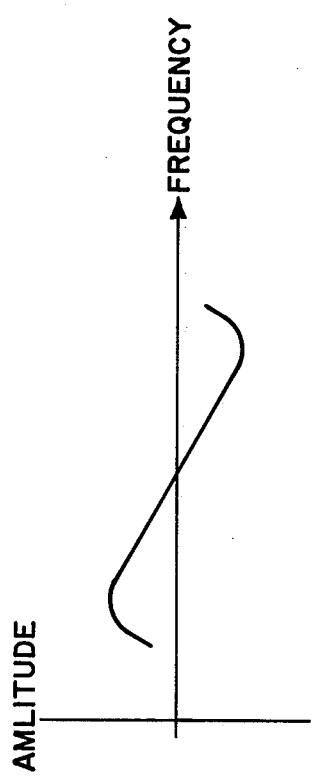
FIG. 5

DEMODULATOR FOR PM OR FM SIGNALS

BACKGROUND OF THE INVENTION

1. Field of the invention

This invention relates to a demodulator for demodulating phase modulated (PM) or frequency modulated (FM) signal into a baseband signal and use of such a demodulator in an RF receiver.

2. Prior Art

Demodulators for handling RF signals and RF receivers utilizing such demodulators have been highly developed and extensively utilized, in many areas, such as radio receivers of AM/FM types, telemetry, telecommunications, etc. In recent years, with the advent of space technology, further advances have been made to extend the RF receiver and the associated demodulation technique into deep space communications where signal is exposed to highly noisy environment. Great efforts have been channelled to further refine and improve the RF receivers and, in particular, the demodulator used in such receivers. A main thrust of such efforts has been directed to improve a demodulator used to convert an IF signal into a baseband signal where such baseband signal is utilized for various ultimate intended purposes, such as a self destruct audio command signal, for destroying a space borne vehicle which may be off track and which may pose threat to the safety.

SUMMARY OF THE INVENTION

It is an object of the present invention to provide an improved demodulator which provides a more reliable performance.

It is another object of the present invention to provide an improved RF signal receiver.

The foregoing and other objects of the present invention is achieved in accordance with the present invention by a demodulator for demodulating a phase modulated (PM) or a frequency modulated (FM) signal into a baseband signal. The demodulator includes a detector arrangement designed in a form similar to Travis detector for converting said PM or FM signal into two outputs, means for summing the two outputs, and means for modifying the summed outputs to generate the baseband signal of substantially the same amplitude across its frequency spectrum.

According to another feature of the present invention, the demodulator is provided with an operational amplifier for amplifying the summed outputs, and resistive means and capacitive means operatively coupled in shunt with the operational amplifier to provide a feedback control.

The foregoing and other objects and features and advantages of the present invention will be more clearly apprehended from the following detailed description of an illustrative embodiment of the present invention in conjunction with the accompanying drawings.

BRIEF DESCRIPTION OF THE DRAWINGS

FIGS. 2A, 2B, 3, 4A, 4B and 5 show signal characteristics in graphic form which are helpful in the understanding of the operation of the demodulator of FIG. 1.

FIG. 6 shows another embodiment of a discriminator-summing circuit of a demodulator according to the present invention.

DETAILED DESCRIPTION OF THE DRAWINGS

Figure 1:
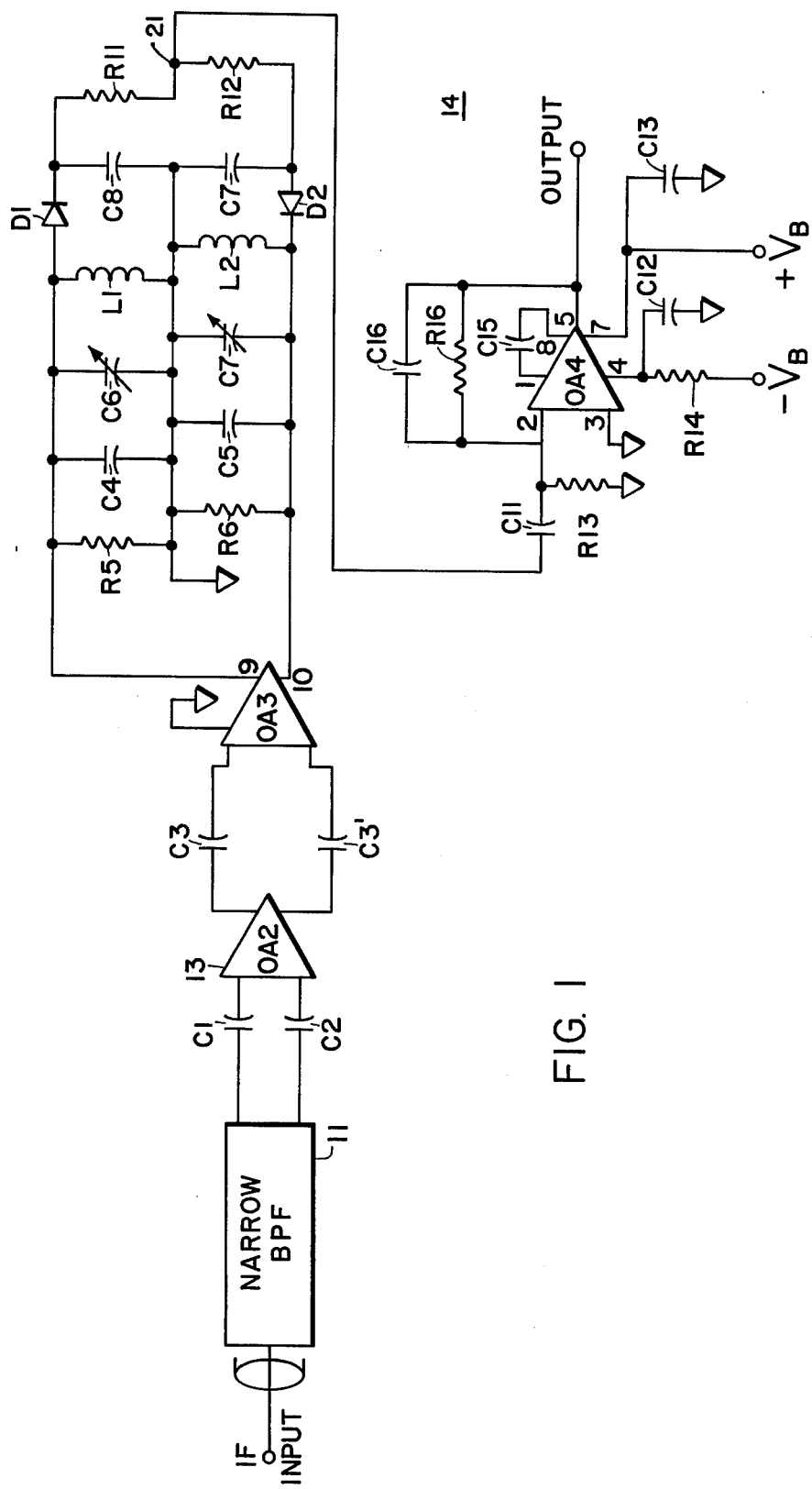
FIG. 1 shows a demodulator of the present invention.

In a conventional demodulator, it is generally known that a Travis detector is utilized to convert an FM signal into its base band signal. The Travis detector arrangement typically comprises high frequency and low frequency detectors, the outputs of which are gated through corresponding diodes and then applied to the positive and negative terminals of a differential amplifier to derive the output baseband signal.

It is found that a Travis detector arrangement performs reasonably satisfactorily in handling the FM modulated signal. But it is found that it cannot handle the phase modulated (PM) signal satisfactorily; it is found that when conventional Travis detector arrangement is used to demodulate the phase modulated (PM) signal, the output tends to be nonlinear. The foregoing is graphically illustrated in FIGS. 2A, 2B, 3, 4A and 4B. FIGS. 2A and 2B show the frequency spectrum characteristics of the FM and PM signals, respectively as generally known. As shown in FIG. 2A, the FM spectrum has the characteristics that the energy level of its carrier and two modulated tone sidebands $f_{c1}, f_{c2}$, tend to decrease in a linear fashion, for example, at 6 db per octave. Thus, the energy levels of the first and second sideband frequencies tend to decrease in amplitude. In contrast, the energy level of the sideband frequencies, $f_{c1}$, fc2, of PM signal tend to remain at a uniform amplitude as shown in FIG. 2B, at a low modulation index. At a higher modulation index, the aforementioned relationship holds generally; but they are modified by the Bessel expansion and consequently are quite complex for verbalization.

Travis detector detects the FM or PM input and converts it into an amplitude modulated signal as shown in FIG. 3. As shown, Travis detector includes high (e.g., R5, C4, C6, L1) and low frequency (e.g., R6, C5, C7, L2) tuned circuits symmetricaly tuned about the IF carrier frequency and corresponding amplitude detectors (e.g., D1 and D2) for sensing the amplitudes of corresponding high and low tuned circuit output. Travis detector provides an output baseband signal of substantially the same amplitude across its spectrum when it is used to detect FM signals, as illustrated in FIG. 4A. It is found however that a Travis filter provides an output of nonuniform amplitude level across the frequency spectrum of the baseband signal, as illustrated in FIG. 4B, when it is used to obtain the baseband signal from a PM signal.

In accordance with an aspect of the present invention, the demodulator is designed to overcome the nonuniformity of the energy amplitude of the baseband signal across its frequency spectrum. This is accomplished by modifying the Travis detector by providing means for summing the two outputs and an operational amplifier with a capacitor and a resistor shunted thereacross for generating the baseband signal from the summed two outputs of the modified Travis filter.

FIG. 1 illustrates the demodulator in accordance with the present invention in a schematic form. As shown, demodulator includes a conventional narrow bandpass filter 11 for filtering out unwanted noise. The output of the filter 11 is applied to an IF amplifying arrangement 13 via coupling capacitive means C1 and C2. The output of the IF amplifier is applied to a demodulator 14 via capacitive means C3 and C3' in accordance with the present invention. The IF amplifying circuitry may include two or more stages of amplifying circuitry which may be in the form of any suitable IF amplifiers.

The output of the amplifier is then applied to a limiter OA3. The limiter OA3 may be of a design to provide amplitude limiting characteristics and two isolated outputs at two pins 9 and 10 of OA3, as illustrated. The two outputs are then applied to two resonant circuits, one (C4, C6, L1) tuned high and the other (C5, C7 and L2) tuned low. Two diodes D1 and D2 poled in opposite directions as illustrated are used to demodulate the FM or PM signal.

In accordance with an aspect of the present invention the output of the two diodes are summed via resistive means R11 and R12 at a common node 21. The combined output is then applied to an operational amplifier OA4 via a conventional RC coupling means made of capacitor C11 and resistor R13. C11 is used to block out any DC components in the usual manner. Various pin positions of the operational amplifier OA4 may be connected as schematically illustrated in FIG. 1 to operate it in a desired way. Thus, one input of the operational amplifier OA4 at pin 3 is connected to the ground. The pin 4 is connected to a biasing source $-V_B$ via resistor R14. The capacitor C12 is provided as illustrated to ground out noise signal contributed by the power source, $-V_B$. The pin 7 is connected to another bias source $+V_B$ in establishing the biasing level of the operational amplifier OA4. Capacitor C13 is in shunt to shunt out the noise signal contributed by the power source $+V_B$. The pins 1 and 8 are connected across a capacitor C15 used in some operational amplifiers to provide stability compensation. The connection of the pins 3, 4, 7 8, and 1 in the aforementioned manner is of a conventional nature for adjusting the operational parameters of the operational amplifier OA4 and so need not be described further. Preferably, the operational amplifier OA4 is a high gain amplifier type that provides gains in the order of 100,000 to render the operational amplifier extremely sensitive.

Now referring, to FIG. 1, there is provided a capacitor C16 and a resistive R16 in shunt with the operational amplifier OA4 between the input at the pin 2 and the output at pin 5 thereof. The RC network made of the capacitor C16 and the resistor R16 provides an impedance feedback circuitry for modifying the gain characteristics in terms of the amplitude versus frequency spectrum of the operational amplifier. This, in turn, modifies the frequency versus amplitude characteristics of the baseband signal recovered at the output terminal 5. More particularly, the impedance circuitry is configured to operate with the summing resistors R11 and R12 to provide an output baseband signal of a relatively uniform amplitude across its baseband frequency spectrum when a modulated signal is demodulated. When the demodulator is used to demodulate a frequency modulated signal, then the feedback capacitor C16 can be removed or made very small.

FIGS. 4A and 4B and 5 illustrate operational characteristics of the improved demodulator in accordance with the present invention. As shown in FIG. 5, for the PM case, the output of the summed signal or baseband signal, without the suitable feedback control, appears in the form of a baseband signal waveform BB, with increasing amplitude as the baseband signal frequency increases. The manner in which the summed outputs are modified whereby a baseband signal of relatively uniform amplitude across its frequency spectrum is obtained is illustrated in a waveform designated UB in FIG. 5. By using the suitable impedance circuitry shunted across the operational amplifier OA4, its gain characteristics are modified in a manner to decrease its gain versus frequency somewhat in the opposite direction as shown in frequency response characteristics OA in FIG. 5 and thereby, to compensate the nonuniform characteristics of the summed output BB. The baseband signal output UB of relatively uniform amplitude over a range of frequency is the result of a sum; of the two functions BB and OA, as illustrated in FIG. 5, UB. Various circuit parameters may be adjusted, as required, so that the amplitude below the baseband signal, BW, of interest drops 3 db or more.

The demodulator of the present invention as described above is distinguishable over the conventional Travis detector in a number of ways. For example, in the conventional Travis detector, the diodes are poled in the same direction. In contrast, in the present modification, the diodes D1 and D2 are oppositely poled. Secondly, in the conventional Travis detector, the output of the two detected signals are not summed but applied to a differential amplifier directly. In contrast, here the output of the two detectors are summed at the common summing point 21 through resistors R11 and R12. Thus, the use of the sum of the two outputs of a Travis detector to detect the envelope for the high end and the low end of the frequency is new.

In operation, the demodulator is designed to drive the summing point to near zero so that the two diode detectors will not interfere with the operation of each other in their detection function as explained below.

This is readily achieved by utilizing the feedback circuitry formed by the capacitive means C16 and resistive means R16. While the feedback means is shown in the form of parallel network of a capacitor and a resistor connected in shunt across the operational amplifier OA4, they need not be so limited. More importantly and more generally, the feedback circuitry should be selected of an impedance network having resistance value and reactance value of such a character that it modifies the main characteristic of the operational amplifier OA4 in a way to impose the desired effect on the signal characteristics, e.g., amplitude versus frequency, of the signal being amplified, specifically, phase modulation versus frequency modulation. The amplitude of the summed signal at the summing point 21 is made extremely small by the advantageous use of the operational amplifier OA4.

While the above described approach to nulling the summing point amplitude is satisfactory, a further improvement can be made by better balancing DC components of the diode detector outputs. This is accomplished by operatively coupling resistors R21 and R22 of suitable resistance across C7 and C8 as illustrated in FIG. 6. The resistors serve the function of DC balancing the diode detector outputs. An alternate way of providing better DC balance is to couple a resistor, R23, between the summing point 21 and ground.

The present demodulator provides improved sensitivity because the two detector (D1 and D2) outputs are summed independently of each other by utilization of the summing and feedback means. Also, the demodulator in accordance with the present invention provides proper demodulation of PM modulated signals, i.e., it provides a demodulated output of substantially the same amplitude across the output baseband spectrum. This is especially advantageous in the demodulation of PM signals with large deviation.

The principle of summing the detected outputs and then amplifying the summed output using an operational amplifier in a feedback and summing mode, as described above need not be limited in terms of its application to handling a Travis detector output. It can be readily applied to handle the outputs of other types of detectors, such as the well known Foster-Seely detector.

The aforedescribed demodulator may be advantageously used in an RF receiver for receiving a baseband audio signal from an RF signal of S band. The RF receiver may include an RF converter for receiving the RF signal and downbeating it to an IF signal. The present inventive demodulator 14 may then be used to convert the IF signal into the baseband signal at its output. Additionally, automatic gain control (AGC) circuitry may also be used to provide the usual AGC function to the IF amplifier. Various changes and modifications will be apparent to one skilled in the art without departing from the spirit and scope of the present invention.

What is claimed is:

1. An apparatus for demodulating a phase modulated or a frequency modulated signal into a baseband signal, comprising:

a detector arrangement for converting the phase modulated or the frequency modulated signal into first and second outputs and including a first passive resonant circuit tuned to provide the first output of said detector arrangement and a second passive resonant circuit tuned to provide the second output of said detector arrangement;

resistive means coupled to said detector arrangement for summing the first and second outputs thereof, means for modifying the summed outputs to generate the baseband signal of substantially the same amplitude across its frequency spectrum; and AC coupling means connected to said resistive means and said modifying means for coupling only AC signals representative of the summed outputs therebetween.

* * * * *